United States Patent [19]

Gruetzmacher et al.

[11] Patent Number: 4,460,675

[45] Date of Patent: Jul. 17, 1984

[54] PROCESS FOR PREPARING AN OVERCOATED PHOTOPOLYMER PRINTING PLATE

[75] Inventors: Robert R. Gruetzmacher, Chadds Ford, Pa.; Stanley H. Munger, Rumson, N.J.

[73] Assignee: E. I. Du Pont de Nemours and Company, Wilmington, Del.

[21] Appl. No.: 546,154

[22] Filed: Oct. 27, 1983

Related U.S. Application Data

[62] Division of Ser. No. 341,250, Jan. 21, 1982, Pat. No. 4,427,759.

[51] Int. Cl.$^3$ .................................................. G03C 5/00
[52] U.S. Cl. .................................... 430/300; 430/306; 430/309; 430/328; 430/273; 430/283; 430/285; 430/286
[58] Field of Search ............... 430/300, 306, 273, 271, 430/281, 283, 285, 286, 309, 328; 156/234; 427/365

[56] References Cited

U.S. PATENT DOCUMENTS

| | | | |
|---|---|---|---|
| 3,287,152 | 11/1966 | Alles et al. | 117/34 |
| 3,990,897 | 11/1976 | Zuerger et al. | 96/67 |
| 4,179,531 | 12/1979 | Hein et al. | 430/300 |
| 4,228,534 | 8/1981 | Shinozaki et al. | 346/135.1 |
| 4,323,636 | 4/1982 | Chen | 430/271 |
| 4,323,637 | 4/1982 | Chen et al. | 430/271 |
| 4,369,246 | 1/1983 | Chen et al. | 430/306 |

FOREIGN PATENT DOCUMENTS 1366769 11/1974 United Kingdom .

*Primary Examiner*—Jack P. Brammer

[57] ABSTRACT

Process for preparing flexographic photopolymer elements by passing into the nip of a calender a photopolymer composition mass comprising elastomeric binder, monomeric compound, and photoinitiator and calendering the photopolymer composition either between (1) a support and multilayer cover element consisting essentially of a flexible cover film, optionally a flexible polymeric film, e.g., polyamide, and a layer of elastomeric composition which is photosensitive or becomes photosensitive during or after calendering, or between (2) two supports, one of which is removed prior to contact, e.g., by lamination or pressing, with the multilayer cover element. The flexographic photopolymer elements are useful for flexographic printing, e.g., dry-offset, letterpress printing.

19 Claims, No Drawings

PROCESS FOR PREPARING AN OVERCOATED PHOTOPOLYMER PRINTING PLATE

This is a divisional of application Ser. No. 341,250 filed Jan. 21, 1982 now U.S. Pat. No. 4,427,759.

DESCRIPTION

1. Technical Field

This invention relates to a process for preparing a photopolymer element bearing an overcoat layer. More particularly this invention relates to a process for preparing an overcoated photopolymer element wherein the overcoat layer is photopolymerizable.

2. Background Art

Flexographic printing plates are well known for use in letterpress printing particularly on surfaces which are soft and easily deformable such as packaging materials, e.g., cardboard, plastic films, etc. Rubber plates are widely used for flexographic printing. Such plates are disadvantageous, however, because they are conventionally prepared by a laborious procedure involving art work, photographic negative, photoengraving, formation of a phenolic matrix, and hot press molding of a rubber plate. Flexographic printing elements having resilient surfaces can be prepared from elastomeric photopolymer compositions as described in Chen and Brennan U.S. application Ser. No. 222,713, filed Jan. 5, 1981, now U.S. Pat. No. 4,323,637. Such photopolymer elements have a flexible, polymeric film interposed between a cover sheet and the surface of the photopolymer layer. Upon imagewise exposure to actinic radiation, insolubilization of the photopolymer layer occurs in the exposed areas. Treatment with a suitable solvent removes the polymeric film and the unexposed areas leaving a printing relief.

The flexographic photopolymer compositions can be formed into sheets or layers by several known methods such as solvent casting, hot pressing, calendering and extrusion. A preferred method is by calendering between two sheets or films, including multiple layer or compound films. A film bearing a thin layer of flexible, polymeric film is an example of a compound film. During calendering at elevated temperatures with this compound film, the flexible, polymeric layer in contact with the relatively harder photopolymer layer melts or flows causing rough or smudge areas in the photopolymer layer. These rough areas may appear in the final flexographic printing plate.

A preferred method of manufacturing flexographic printing elements, is by extrusion of the photopolymer composition followed by calendering the photopolymer composition between two flat surfaces, generally two films. Frequently when the photopolymer melt is extruded through a die, imperfections along the die lip, e.g., small bits of hardened photopolymer, cause the formation of grooves in the rotating polymer bank. The grooves would normally disappear during calendering. It has been found, however, that due to the presence of the flexible, polymeric film which comes into contact with the hot photopolymer layer during calendering the grooves formed are filled with flowing polymer film material. When the printing element is processed by solvent development, the flexible, polymeric film is removed, and the previously filled grooves reappear and are visible as surface streaks. Such streaks are highly undesirable in the flexographic printing plates.

It is an object of this invention that a flexographic photopolymer element be provided that upon imagewise exposure and development possesses a hard, substantially smooth printing surface without surface streaks. Another object is to provide such a printing surface which possesses improved solvent resistance, exposure latitude with reverse depth, ink transfer and wearing properties.

DISCLOSURE OF THE INVENTION

In accordance with this invention there is provided in a process for preparing flexographic photopolymerizable elements which comprises passing into the nip of a calender a mass of a photopolymerizable composition comprising an elastomeric binder, an ethylenically unsaturated compound having at least one terminal ethylenic group, and a photoinitiator or photoinitiator system, and calendering the photopolymerizable composition between a support and a multilayer cover element to form a photopolymerizable layer therebetween, the improvement wherein the multilayer cover element consists essentially of a flexible cover film, optionally a flexible polymeric film, and a layer of an elastomeric composition which is photosensitive or becomes photosensitive during or after calendering by contact with the photopolymerizable layer.

This invention relates to an improved calendering process for preparing flexographic elements utilizing photopolymerizable compositions. The photopolymerizable composition comprises an elastomeric binder such as a block copolymer, a nongaseous ethylenically unsaturated compound having at least one terminal ethylenic group, an organic, radiation-sensitive, free-radical generating photoinitiator or system, preferably a dye, as well as other additives discussed below.

Polymeric molecular weights referred to herein are number average molecular weights. The number average molecular weights for polymers such as the block copolymers can be determined by membrane osmometry utilizing a gel cellophane 600 W membrane manufactured by Arro Laboratories, Inc., Joliet, Illinois, toluene as the solvent at 29° C. The $\overline{M}n$ for the nonelastomeric polymer blocks and elastomeric polymer blocks are preferably determined as follows:

A. The molecular weight of the first block (polystyrene) can be measured by gel permeation chromatography (GPC) of a terminated sample removed immediately after the polymerization. The chromatograph is calibrated using commercially available polystyrene molecular weight standards.

B. The $\overline{M}n$ of the second block (polyisoprene or polybutadiene) can be determined in the following manner:

(1) measuring by suitably calibrated GPC the $\overline{M}n$ of a sample of polystyrene-polyisoprene (or polybutadiene) diblock polymer terminated and removed immediately after its polymerization, and (2) subtracting from this value the $\overline{M}n$ of the first block as determined in (A) above.

C. The $\overline{M}n$ of the third block (polystyrene or other polymer) can be determined in the same general manner:

(1) measuring by suitably calibrated GPC the $\overline{M}n$ of the sample of polystyrene-polyisoprene (or polybutadiene)-polystyrene triblock polymer, and (2) subtracting from this value the $\overline{M}n$ of the diblock polymer obtained in (B) above.

One essential ingredient of the photopolymer composition is a high molecular weight elastomeric, polymeric binder, preferably a block copolymer having at least one unit of the general formula, A-B-A, wherein each A is an independently selected nonelastomeric polymer block having a number average molecular weight ($\overline{M}n$) of 2000–100,000 and a glass transition temperature above 25° C. and B is an elastomeric polymer block having a number average molecular weight between about 25,000 and 1,000,000 and a glass transition temperature between about 10° C. The nonelastomeric blocks, A, having between them an elastomeric block, B, together comprise the unit A-B-A which represents the copolymers particularly suitable for use in combination with the photopolymerizable components in the compositions of the invention. This unit may comprise the entire general formula of the copolymer; it may be appended to another polymer chain; or it may be repeating. It is, of course, possible to vary the precise nature of the unit within the scope of the invention, e.g., by using two different nonelastomeric terminal blocks, A, wherein the glass transition temperature of one terminal block is between −30° C. and ±25° C. or by creating block or graft polymeric substitutions in blocks A and B. Preferably, the elastomeric mid-section blocks, B, are polymers of aliphatic conjugated diolefins while the nonelastomeric blocks, A, are those formed by polymerizing alkenyl aromatic hydrocarbons, preferably vinyl substituted aromatic hydrocarbons, and still more preferably vinyl monocyclic aromatic hydrocarbons. Suitable block copolymers are disclosed in Holden et al. U.S. Pat. No. 3,265,765 and counterpart British Pat. No. 1,000,090, hereby incorporated by reference. Particularly preferred species of the subject copolymers comprise block copolymers of polystyrene terminal groups connected by a mid-section of polyisoprene or polybutadiene, e.g., polystyrene-polyisoprene-polystyrene or polystyrene-polybutadiene-polystyrene, the polydiene block being 70 to 90% by weight of the block copolymer. Other typical block copolymers useful in this invention are polystyrene-polybutadiene-polystyrene and polystyrene-polyisoprene-polystyrene block copolymers which have been hydrogenated according to the teachings of Jones, U.S. Pat. No. 3,431,323 and Hefele et al., U.S. Pat. No. 3,333,024. The hydrogenated block copolymers have the additional advantage of improved thermal and oxidative resistance. However, some residual unsaturation in hydrogenated block copolymers is desirable, since only very small concentrations of monomer are then needed in the photosensitive compositions to reduce solvent solubility upon exposure to actinic radiation. Still other typical block-copolymers useful in this invention are those wherein the terminal blocks are polyalkyl styrenes, e.g., poly(α-methyl styrene)-polyisoprene-poly(α-methyl styrene), and those composed of a plurality of polymer blocks, e.g., polyisoprene-polystyrene-polybutadiene-polystyrene-polyisoprene. Other elastomeric binders which are useful in the photopolymer compositions include: polymers of 1,3-butadiene, hydrocarbon- and halogen-substituted 1,3-butadiene, copolymers of 1,3-butadiene monomers with acrylic, alkylacrylic acids or the corresponding esters and/or nitriles, copolymers of 1,3-butadienes with aryl olefins, e.g., styrene, divinyl benzene, etc. Other elastomeric polymers are also useful, e.g., polyurethanes, carbonated polyvinyl alcohol, etc. Examples of such elastomeric polymeric binders are disclosed in Canadian Pat. No. 614,181 and U.S. Pat. Nos. 2,948,611, 4,177,074, 4,247,624, and 4,272,608, hereby incorporated by reference.

Useful addition-polymerizable ethylenically unsaturated compounds which form compatible mixtures with the aforesaid thermoplastic, elastomeric polymeric binders include:

t-butyl acrylate
N,N-diethylaminoethyl acrylate
1,4-butanediol diacrylate
hexamethylene glycol diacrylate
decamethylene glycol diacrylate
2,2-dimethylolpropane diacrylate
tripropylene glycol diacrylate
trimethylol propane triacrylate
2,2-di(p-hydroxyphenyl)-propane diacrylate
2,2-di(p-hydroxyphenyl)-propane dimethacrylate
polyoxyethyl-2,2-di(p-hydroxyphenyl)-propane dimethacrylate
polyoxypropyltrimethylol propane triacrylate (462)
butylene glycol dimethacrylate
hexamethylene glycol dimethacrylate
2,2,4-trimethyl-1,3-pentanediol dimethacrylate
1-phenyl ethylene-1,2-dimethacrylate
trimethylol propane trimethacrylate
diallyl fumarate
styrene
1,4-diisopropenyl benzene
1,3,5-triisopropenyl benzene, etc.

Compounds having two ethylenic groups are particularly preferred.

The photopolymer compositions of this invention essentially do not scatter the actinic radiation when in the form of thin layers, e.g., about 0.0005 to about 0.250 inch (0.013 to about 6.35 mm). In order to secure an essentially transparent mixture, i.e., a nonlight-scattering mixture, the elastomeric binder component should be compatible with and preferably soluble in, the ethylenic component when used within the aforementioned ratio range of 99:1 to about 1:1 wherein the ratio is the weight of elastomeric binder used to the weight of addition-polymerizable, ethylenically unsaturated compound used.

By compatibility is meant the ability of two or more constituents to remain dispersed with one another without causing appreciable scattering of actinic radiation. Compatibility is often limited by the relative proportions of the constituents and incompatibility is evidenced by formation of haze in the photosensitive composition. Some slight haze of layers formed from such compositions before or during exposure can be tolerated in the preparation of printing reliefs therefrom but when fine detail is desired, haze is preferably avoided. The amount of monomer used is therefore limited to those compatible concentrations below that which produces undesired light scatter or haze. The above compatible ethylenically unsaturated compounds form high-molecular weight addition polymers readily by photoinitiated addition polymerization in the presence of an addition polymerization initiator. Of course, the initiator absorbs sufficient radiant energy to initiate polymerization or cross-linking.

Another essential ingredient of the photopolymer compositions of this invention is an organic, radiation-sensitive, free-radical generating system. Practically any organic, radiation-sensitive, free-radical generating system which initiates polymerization of the unsaturated compound and does not excessively terminate the polymerization can be used in the photopolymer compositions of this invention. The term "organic" is used here and in the claims to designate compounds which contain carbon, and one or more of oxygen, hydrogen, nitrogen, sulfur and halogen, but no metal. Because process transparencies transmit heat originating from conventional sources of actinic radiation, and since the photopolymer compositions are usually prepared under conditions resulting in elevated temperatures, the preferred free-radical generating compounds are inactive thermally below 85° C. and more preferably below 185° C. They should be dispersible in the composition to the extent necessary for initiating the desired polymerization or crosslinking under the influence of the amount of radiation absorbed in relatively short term exposures. These initiators are useful in amounts from about 0.001 to about 10% by weight, and preferably from about 0.1 to about 5% based on the total weight of the solvent-free photopolymer composition.

The free-radical generating system absorbs radiation within the range of about 2000 to about 8000 Å and has at least one component that has an active radiation absorption band with molar extinction coefficient of at least about 50 within the range of about 2500 to about 8000 Å, and preferably about 2500 to about 5000 Å. The term "active radiation absorption band" means a band of radiation which is active to produce the free radicals necessary to initiate polymerization or crosslinking of the unsaturated material.

The free-radical generating system can comprise one or more compounds which directly furnish free radicals when activated by radiation. It can also comprise a plurality of compounds, one of which yields the free radicals after having been caused to do so by a sensitizer which is activated by the radiation.

A large number of such free-radical generating compounds can be utilized in the practice of the invention and include aromatic ketones such as benzophenone, Michler's ketone [4,4'-bis(dimethylamino)benzophenone], 4,4'-bis(diethylamino)benzophenone, 4-acryloxy-4'-dimethylaminobenzophenone, 4-acryloxy-4'-diethylaminobenzophenone, 4-methoxy-4'-dimethylaminobenzophenone, 2-phenyl-2,2-dimethoxyacetophenone (2,2-dimethoxy-1,2-diphenyl ethanone), 2-ethylanthraquinone, phenanthraquinone, 2-t-butylanthraquinone, 1,2-benzanthraquinone, 2,3-benzathraquinone, 2,3-dichloronaphthoquinone, benzil dimethyl acetal, and other aromatic ketones; benzoin, benzoin ethers such as benzoin methyl ether, benzoin ethyl ether, benzoin isobutyl ether, and benzoin phenyl ether, methylbenzoin, ethylbenzoin and other benzoins; and 2,4,5-triarylimidazolyl dimers such as 2-(o-chlorophenyl)-4,5-diphenylimidazolyl dimer, 2-(o-chlorophenyl)-4,5-di(m-methoxyphenyl)imidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2,4-di(p-methoxyphenyl)-5-phenylimidazolyl dimer, 2-(2,4-dimethoxyphenyl)-4,5-diphenylimidazolyl dimer, 2-(p-methylmercaptophenyl)-4,5-diphenylimidazolyl dimer, etc., as disclosed in U.S. Pat. Nos. 3,479,185 and 3,784,557 and in British Pat. Nos. 997,396 and 1,047,569. These patents are incorporated herein by reference.

The imidazolyl dimers can be used with a free-radical producing electron donor such as 2-mercaptobenzoxazole, Leuco Crystal Violet or tri(4-diethylamino-2-methylphenyl)methane. Such sensitizers as Michler's ketone may be added. Various energy transfer dyes such as Rose Bengal and Eosin Y can also be used.

Additional examples of suitable initiators are disclosed by Plambeck in U.S. Pat. No. 2,760,863 which is incorporated by reference.

The photopolymer compositions may also contain a small amount of thermal addition polymerization inhibitor, e.g., 0.001% to 2.0%, based on the weight of the total solvent-free photopolymer composition. Suitable inhibitors include hydroquinone and alkyl and aryl-substituted hydroquinones, 2,6-di-tert-butyl-4-methylphenol, p-methoxyphenol, tert-butylpyrocatechol, pyrogallol, beta-naphthol, 2,6-di-tert-butyl-p-cresol, phenothiazine, pyridine, nitrobenzene, dinitrobenzene and the nitroso dimer inhibitor systems described in U.S. Pat. No. 4,168,982 which is incorporated by reference. Other useful inhibitors include p-toluquinone, chloranil and thiazine dyes, e.g., Thionine Blue G (CI 52025), Methylene Blue B (CI 52015) and Toluidine Blue (CI 52040). Such compositions can be photopolymerized or photocrosslinked without removal of the inhibitor. The preferred inhibitors are 2,6-di-tert-butyl-4-methylphenol and p-methoxyphenol.

Other additives include: colorants, e.g., dyes; antioxidants, antiozonants, fillers or reinforcing agents, plasticizers, etc. The colorants present in the photopolymer composition must not interfere with the imagewise exposure. Suitable colorants are designated "window dyes" which do not absorb actinic radiation in the region of the spectrum that the initiator present in the composition is activatable. The colorants include: CI 109 Red dye, Methylene Violet (CI Basic Violet 5), "Luxol" Fast Blue MBSN (CI Solvent Blue 38), "Pontacyl" Wool Blue BL (CI Acid Blue 59 or CI 50315), "Pontacyl" Wool Blue GL (CI Acid Blue 102 or CI 50320), Victoria Pure Blue BO (CI Basic Blue 7 or CI 42595), Rhodamine 3 GO (CI Basic Red 4), Rhodamine 6 GDN (CI Basic Red 1 or CI 45160), 1,1'-diethyl-2,2'-cyanine iodide, Fuchsine dye (CI 42510), Calcocid Green S (CI 44090) and Anthraquinone Blue 2 GA (CI Acid Blue 58), etc.

Antioxidants useful in this invention include: alkylated phenols, e.g., 2-6-di-tert-butyl-4-methylphenol; alkylated bis-phenols, e.g., 2,2-methylene-bis-(4-methyl-6-tert-butylphenol); 1,3,5-trimethyl-2,4,6-tris-(3,5-di-tert-butyl-4-hydroxybenzyl)benzene; 2-(4-hydroxy-3,5-di-tert-butylanilino)-4,6-bis-(n-octyl thio)-1,3,5-triazine; polymerized trimethyldihydroquinone; and dilauryl thiopropionate.

Antiozonants useful in this invention include: microcrystalline wax and paraffin wax; dibutylthiourea; 1,1,3,3-tetramethyl-2-thiourea; Antiozonant AFD, a product of Nafton Co.; norbornenes, e.g., di-5-norbornene-2-methyl adipate, di-5-norbornene-2-methyl terephthalate; Ozone Protector 80, a product of Reichhold Chemical Co.; N-phenyl-2-naphthylamine; unsaturated vegetable oils, e.g., rapeseed oil, linseed oil, safflower oil; polymers and resins, e.g., ethylene/vinyl acetate copolymer resin, chlorinated polyethylene, chlorosulfonated polyethylene, chlorinated ethylene/methacrylic acid copolymer, polyurethanes, polypentadienes, polybutadiene, furfural-derived resins, ethylene/propylene/diene rubber, diethylene glycol ester of rosin and alpha-methylstyrene/vinyltoluene copolymer. Ozone resistance of the printing relief produced can also be improved by annealing it at elevated temperatures prior to use.

If desired, the photopolymer compositions can also contain immiscible, polymeric or nonpolymeric organic or inorganic fillers or reinforcing agents which are essentially transparent at the wavelengths used for exposure of the photopolymer material and which do not scatter actinic radiation, e.g., polystyrene, the organophilic silicas, bentonites, silica, powdered glass, colloidal carbon, as well as various types of dyes and pigments. Such materials are used in amounts varying with the desired properties of the elastomeric compositions. The fillers are useful in improving the strength of the elastomeric layer, reducing tack and, in addition, as coloring agents.

The photopolymer layer preferably contains a compatible plasticizer to lower the glass transition temperature of the binder and facilitate selective development. The plasticizer may be any of the common plasticizers compatible with the polymeric binders. Among the common plasticizers are dialkyl phthalates, alkyl phosphates, polyethylene glycol, polyethylene glycol esters, and polyethylene glycol ethers. Other useful plasticizers include oleic acid, lauric acid, etc. Polyesters are preferred plasticizers, e.g., polyethylene sebacate, etc. The plasticizer is generally present in an amount of 1 to 15% by weight based on weight of total solids of the photopolymer composition.

The photopolymer compositions of this invention can be prepared in many ways by admixing the three essential constituents specified above, i.e., (A) the compatible solvent-soluble elastomeric binder compounds described above, (B) the addition-polymerizable, ethylenically unsaturated compound containing at least one terminal vinylidene group, and, uniformly dispersed throughout, (C) an addition-polymerization initiator activatable by actinic radiation. For example, flowable or extrudable compositions can be made by mixing them and other desired adjuvants in any order and, if desired, with the aid of a solvent, e.g., chlorinated hydrocarbons, e.g., chloroform, carbon tetrachloride, trichloroethylene and chlorotoluene; ketones, e.g., methyl ethyl ketone, diethyl ketone and methyl isobutyl ketone; aromtic hydrocarbons, e.g., benzene, toluene and xylene; and tetrahydrofuran. The above solvents can contain as diluents small amounts of acetone, lower molecular weight alcohols, e.g., methyl, ethyl, propyl; aliphatic hydrocarbons such as petroleum ether and solvent naphtha; and esters, e.g., methyl, ethyl and butyl acetate. The solvent can be removed later by heating the admixture or extruded layer.

The photopolymer composition can be formed into a hot melt by placing in a mixing device such as a rubber mill which may be part of a calender device or by placing in an extruder which performs the function of melting, mixing, deaerating and filtering the composition. A suitable extruder is a twin screw extruder although other known commercial extruders can be used. The temperature of the melt in the extruder is within the range of about 130° to 200° C., and the time the composition remains in the extruder ranges from about 1 to 5 minutes.

The composition is then passed from the mixing device or extruder into the nip of a calender, and the composition is calendered while hot between two smooth flat surfaces. The calendering can occur between two flexible supports including multiple layer or compound supports. Preferably one support is a multilayer cover element. The support preferably is a flexible film or sheet such as a polyethylene terephthalate film, optionally bearing a subbing layer of adhesive, material or primer or a release layer, e.g., of silicone. Other suitable supports include: flame-treated or electron-treated polyethylene terephthalate, polyimide film as disclosed in U.S. Pat. No. 3,179,634 which is incorporated by reference, flexible metal sheets and foils, e.g., steel, aluminum; compound supports such as the above sheet supports with a back layer of an elastomeric composition or rubber, etc. The multilayer cover element consists essentially of a flexible cover film, optionally a flexible polymeric film, and a layer of an elastomeric composition which is photosensitive or preferably becomes photosensitive during or after the calendering by contact with the photopolymer composition. The elastic modulus of the elastomeric layer of the element in the polymerized state should not be substantially less than the elastic modulus of the photopolymer layer in the exposed state. A useful range of elastic modulus of the elastomeric layer is 0.5 to 15 times that of the photopolymer layer when both are in the exposed or polymerized state. The elastomeric modulus is determined by ASTM D-638 taken at 200% elongation.

Useful flexible cover films of the multilayer cover element include: polyethylene terephthalate which preferably is unsubbed but optionally may be subcoated with a thin silicone layer, polystyrene, polyethylene, polypropylene, or other strippable film. The flexible polymeric film layer is present adjacent to the cover film. This layer is solvent soluble or strippable during processing of the exposed element to form a relief image and preferably is a polyamide, copolymer of ethylene and vinyl acetate, etc. The flexible polymeric film thickness is in the range of about 0.0001 to 0.0015 inch (0.0025 to 0.038 mm).

Adjacent to the flexible, polymeric film is a layer of an elastomeric composition (overcoat layer) as described above. The elastomeric composition generally contains an elastomeric material which is the same as or similar to the elastomeric binder present in the photopolymer layer. Different type elastomeric binders can be used in the elastomeric composition and photopolymer layers provided that the layer of elastomeric composition and photopolymer layer have an elastic modulus as described above. Suitable elastomeric polymers have been described previously above in conjunction with the photopolymer composition. Additional components present in the elastomeric coating composition include: a coating solvent, optionally a second binder which can be a nonelastomeric polymer, optionally but preferably a nonmigrating dye or pigment which provides a contrasting color with any colorant, e.g., dye, present in the photopolymer layer, and optionally one or more ethylenically unsaturated monomeric compounds as set forth above, and/or a photoinitiator or initiator system also as described above when the elastomeric composition is photopolymerizable, and optionally antiblocking agents. The second binder can be a polymer or interpolymer of methylmethacrylate/acrylonitrile/butadiene/styrene, styrene/methyl methacrylate, acrylonitrile/butadiene/styrene, butadiene, isoprene, chloroprene, styrene/butadiene, styrene/isoprene or combinations, etc. The contrast color dye can be Acid Blue 92 (CI 13390), or any other dyes disclosed in U.S. Pat. No. 3,218,167, column 5, lines 35 to 44, which is incorporated by reference. Useful solvents are those materials which dissolve or disperse the elastomeric coating composition. Methylene chloride is preferred. Other useful solvents include: acetone, methylene chloride/methanol, perchloroethylene, trichloroethane, benzene, toluene, ethyl "Cellosolve", etc. Useful antiblocking agents include: polyolefin particles or beads, waxes, polyethylene; hard particles or beads such as glass (silicon dioxide), etc. Dioctyl sodium sulfosuccinate or other known slip agents can be used. The antiblocking agent prevents sticking of the multilayer cover element in roll form prior to the calendering operation. The elastomeric coating compositions contain the following parts by weight of indicated components:

| | |
|---|---|
| elastomeric binder | 60 to 100 parts |
| second binder | 0 to 40 parts |
| dye | 0 to 5 parts |
| monomer(s) (optional) | 0 to 20 parts |
| photoinitiator (optional) | 0 to 10 parts |
| solvent | 50 to 95 parts |

In the preparation of a preferred elastomeric coating composition, the dye and tetrapolymer are blended in a mixer at elevated temperature, generally at about 240° to 300° F. (about 116° to 149° C.). The blending temperature can vary, however, depending on the melting point and rheology of the binder. The blend is then chopped and granulated and then mixed with the other ingredients. The coating composition is coated, preferably by means of an extrusion die coater. The dry layer thickness is about 0.0005 to 0.020 inch (about 0.013 to 0.51 mm), preferably 0.001 to 0.005 inch (0.025 to 0.127 mm).

As noted above the calendering of the photopolymer can occur between two supports. When the supports are flexible films or sheets as described above, one is subsequently removed from the surface of the photopolymer layer without damage thereto, and a multilayer cover element also as described above is either laminated to the photopolymer layer at a temperature in the range of 20° to 180° C., or the multilayer cover element and the photopolymer layer are pressed into contact at a temperature of 20° to 180° C. This invention requires that the elastomeric overcoat layer be present adjacent to the photopolymer layer in the manufactured photopolymer elements used to prepare flexographic printing plates.

After the photopolymer element is prepared by the calendering operation, it is cooled, e.g., with blown air, and is passed under a bank of fluorescent lamps, e.g., black light tubes, placed transverse to the path of movement. The element is continually exposed through the support to partially polymerize a predetermined thickness of the photopolymer layer adjacent the support, e.g., about 0.001 to 0.030 inch (0.025 to 0.76 mm) for a 0.112 inch (about 2.85 mm) thick photopolymer layer. The element can be cut into suitable size sheets.

Prior to the imagewise exposure described more fully below, the photopolymer element is exposed through its support to polymerize a predetermined thickness of the photopolymer layer adjacent the support. This polymerized portion of the photopolymer layer is designated a floor. The floor thickness varies with the time of exposure, exposure source, etc. The exposure is generally for 1 to 30 minutes.

The cover sheet present on the polymeric film layer can be removed leaving the polymeric and elastomeric films on the photopolymer element. The photopolymer element is then exposed to actinic radiation, e.g., through an image-bearing transparency or stencil having areas transparent to actinic radiation and of substantially uniform optical density and areas opaque to actinic radiation and of substantially uniform optical density until substantial addition-polymerization or photocrosslinking takes place. Thus the radiation-exposed portions of the layer are converted to the insoluble state with no significant polymerization or crosslinking taking place in the unexposed portions or areas of the layer. Unexposed portions of the layer are removed by means of a liquid, e.g., solvent for the thermoplastic-elastomeric block copolymer. During the addition-polymerization or crosslinking, insolubilization occurs and the elastomeric binder/ethylenically unsaturated compound containing composition is converted to the insoluble state. The hard surface of the polymeric film prevents the transparency from sticking or adhering to the surface of the photopolymer element during the imaging steps and is generally removed with the solvent processing step.

Actinic radiation from practically any source and of any type can be used in these initiated processes. The radiation may emanate from point sources or be in the form of parallel rays or divergent beams. By using a broad radiation source, relatively close to the image-bearing transparency, the radiation passing through the clear areas of the transparency enters as divergent beams and thus irradiates a continually diverging area in the photopolymerizable layer underneath the clear portions of the transparency, resulting in a polymeric relief having its greatest width at the bottom of the photopolymerized layer, i.e., a frustum, the top surface of the relief being the dimensions of the clear area. Inasmuch as the free-radical-generating addition-polymerization initiators activatable by actinic radiation generally exhibit their maximum sensitivity in the ultraviolet range, the radiation source should furnish an effective amount of this radiation. Such sources include carbon arcs, mercury-vapor lamps, fluorescent lamps with special ultraviolet-light-emitting phosphors, argon glow lamps, and photographic flood lamps. Of these, the mercury-vapor lamps, particularly the sunlamp or "black light" type, and the fluorescent sunlamps, are most suitable.

The radiation exposure time may vary from fractions of a second to minutes, depending upon the intensity and spectral energy distribution of the radiation, its distance from the composition and the nature and amount of the composition available. Customarily, a mercury vapor arc, a sunlamp or high ultraviolet output fluorescent tubes are used at a distance of about 1.5 to about 60 inches (3.8 to 152 cm) from the photopolymer composition. Exposure temperatures are not particularly critical, but it is preferred to operate at about ambient temperatures or slightly higher, i.e., about 20° to about 35° C.

When highly reflective supports are used, oblique rays passing through clear areas in the image-bearing transparency will strike the surface of the base at an angle other than 90° and after reflection will cause polymerization in the nonimage areas. This disadvantage can be overcome when the photopolymer layer is on a radiation-reflective support by an intervening stratum sufficiently absorptive of actinic radiation so that less than 35% of the incident radiation is reflected. The layer absorptive of reflected radiation or nonradiation scattering layer, or antihalation layer, can be made by dispersing a finely-divided dye or pigment which substantially absorbs actinic radiation in a solution or aqueous dispersion of a resin or polymer which is adherent to both the support and the photoinsolubilized image and coating it on the support to form an anchor layer which is dried. Suitable antihalation pigments include carbon black, manganese dioxide, dyes, e.g., Acid Blue Black (CI 20470) and Acid Magenta O (CI 42685). A dyed metal plate is also useful.

The antihalation layer intermediate between the photopolymer layer and the reinforcing support when used must have adequate adhesion to the reinforcing support and the photopolymer layer and not react with the radiation-absorptive material. Suitable polymeric or resin carriers for the radiation-absorptive dyes or pigments which can be used include polyvinyl compounds, e.g., polyvinyl chloride homopolymers, and copolymers, e.g., vinyl chloride with vinyl acetate, diethyl fumarate or ethyl acrylate. Copolymers of acrylic and methacrylic acid may also be used.

The solvent liquid used for washing or developing the plates made from the photopolymer compositions of this invention should have good solvent or stripping action on the unimaged or unexposed photopolymerizable and elastomeric layers and little action on the insolubilized image areas of the exposed photopolymerizable and elastomeric layers or upon the support material, antihalation layer, or anchor layer in the period required to remove the nonpolymerized or noncrosslinked portions. Methyl ethyl ketone, benzene, toluene, xylene, carbon tetrachloride, trichloroethane, trichloroethylene, methylchloroform, tetrachloroethylene, etc. are particularly useful solvents. Best results are sometimes obtained when the solvent is warm, e.g., 30°–50° C. or when the solvent is used in a mixture with a nonsolvent, e.g., trichloroethylene with ethanol. Incorporation of such nonsolvents reduces swelling of the insolubilized image.

In the development step where the relief is formed, the solvent may be applied in any convenient manner, as by pouring, immersion, spraying, or roller application. Brushing aids in the removal of the unpolymerized or uncrosslinked portion of the composition.

The printing plate, after development, is dried at a temperature in the range of about 40° to 75° C., preferably 60° C., until the plate retains its original thickness. A forced hot air drier or other suitable drier can be used for this purpose. The dry plate can then be given a post exposure treatment or can be detackified or undergo both treatments. Generally the dry plate is detackified for 1 to 3 minutes in a solution such as aqueous acidic hypochlorite or an aqueous solution having a free bromine concentration of 0.01 to 3.5% by weight and pH of 0.7 to 6.5, for about 15 seconds to 20 minutes. Post exposure is accomplished by exposing the developed printing plate to a source of actinic radiation, preferably to the actinic radiation source used for the imagewise exposure. The post exposure can be either prior to or subequent to the detackification treatment and generally is of 5 to 15 minutes duration.

BEST MODE FOR CARRYING OUT THE INVENTION

The best mode of the invention is illustrated in Example 1 wherein the elastomeric overcoat while originally nonphotosensitive becomes photosensitive during calendering.

INDUSTRIAL APPLICABILITY

Printing reliefs made from the photopolymer elements prepared as described in this invention are particularly useful for flexographic printing wherein a resilient print area is required, e.g., for printing on deformable printing surfaces. The ink is carried by the raised portion of the relief such as in dry-offset printing, ordinary letterpress printing, the latter requiring greater height differences between printing and nonprinting areas. The printing plates are also useful for multicolor printing.

The printing reliefs bearing a polymerized elastomeric overcoat surface which provides many advantages over previously known flexographic printing plates. The printing surface can possess a contrasting color with the photopolymer layer. The printing surface is hard which improves printing clarity and exhibits improved ink transfer as well as improved solvent resistance and wear properties. The elements have improved exposure latitude and improved reverse depth, i.e., fine lines in otherwise solid image areas remain uniformly deep over a wide range of exposure conditions. The relief image does not show any "orange peel" defect which is mottle on the relief surface and appears on the printed object.

EXAMPLES

The invention is illustrated by but is not intended to be limited to the following examples wherein the parts and percentages are by weight. The elastic modulus (secant modulus) is determined in the following examples using ASTM D-638 taken at 200% elongation.

EXAMPLE 1

The following elastomeric coating solution is prepared:

| Ingredient | Amount (%) |
| --- | --- |
| Polystyrene-polyisoprene-polystyrene block copolymer[1] | 10.10 |
| Methylmethacrylate(46)/acrylonitrile(9)/butadiene(14)/styrene(31) tetrapolymer resin | 4.70 |
| Atlantic Fast Wood Blue R Conc. dye[2] | 0.20 |
| Methylene chloride | 85.0 |

[1] "Kraton" 1107 block copolymer Shell Chemical Co., Polymers Division, Houston, Texas
[2] C.I. 13390 Acid Blue 92 dye Atlantic Chemical Industries, Nutley, New Jersey.

Prior to preparation of the coating solution, the dye and tetrapolymer resin are blended in a Banbury mixer (1100 g batches at 240° F. (116° C.). The blend is then chopped and granulated.

The above-described elastomeric coating solution is coated by means of an extrusion die coater with a 0.015 inch (0.38 mm) slot onto the surface of an element consisting of a polyamide resin layer, 0.00017 inch (0.004 mm) thick supported by a polyethylene terephthalate film, 0.005 inch (0.127 mm) in thickness. The thickness of the dry coating is 0.002 inch (about 0.051 mm). The supported polyamide layer is prepared as follows:

The following coating solution is prepared:

| Ingredient | Amount (%) |
| --- | --- |
| Methylene chloride | 81.0 |
| Methanol | 2.0 |
| N—methyl pyrolidone | 10.0 |
| Polyamide resin[3] | 7.0 |

[3] The polyamide resin, Macromelt 6900, a product of Henkel Adhesives Company, a division of Henkel Corporaton, 4620 West 77th Street, Minneapolis, MN is essentially colorless, has a Ball and Ring Softening Point, of 266–302° F.; melt index at 347° F. of 5–15 g/10 minutes; flash point 570° F.; percent water absorption, 1 day is 0.2, 7 days is 0.5; tensile yield of 1,200 psi; tensile break of 3,500 psi; and elongation of 540%. The tensile yield, tensile break and elongation are determined at 24° C. according to ASTM Procedure D-1708.

The above polyamide resin coating solution is coated on 0.005 inch (0.127 mm) thick polyethylene terephthalate film using an extrusion die coater to provide a dry film thickness of 0.00017 inch (0.004 mm) on the film.

Onto the dry elastomeric overcoat is laminated at 63° C. a silicone-subbed polyethylene terephthalate film, 0.001 inch (0.025 mm) in thickness, release "Mylar" film, Custom Coating and Laminate, Inc., Worcester, MA, which prevents blocking when the element is wound on wide stock cores. The element from top to bottom has the following configuration: (1) polyethylene terephthalate film with silicone subbing, (2) elastomeric overcoat layer, (3) polyamide resin layer and (4) polyethylene terephthalate support, 0.005 inch (0.127 mm) in thickness.

A photopolymerizable, thermoplastic composition is prepared as follows:

1.40 parts 2,2-dimethoxy-2-phenylacetophenone is dissolved in a mixture of 5.30 parts hexamethylene glycol diacrylate, 3.70 parts hexamethylene glycol dimethacrylate, 0.166 parts 2,6-di-tertiary-butyl-para-cresol and 0.001 part hydroquinone. A solution of C.I. 109 Red Dye (0.003 part) in hydroxyethyl methacrylate (0.13 part) is added to the mixture. This solution is added to 82.30 parts polystyrene-polyisoprene-polystyrene block copolymer ("Kraton" 1107, manufactured by Shell Chemical Co., Polymers Division, Houston, Tex.) in a twin screw extruder. A mixture of 6.0 parts α-methyl styrene/vinyl toluene resin (softening point 100° C., refractive index 1.583, viscosity at 25° C. for a 65% solution in toluene is 1.6–1.9 poises, manufactured by Hercules, Inc., Wilmington, Del.), and 1.0 part grated microcrystalline hydrocarbon wax (melting point 73°–76° C., flash point 113° C., manufactured by International Wax Refining Co., Valley Stream, N.Y.) is melted at about 100° C. and is metered into the photopolymer mixture in the extruder. The twin screw extruder performs the function of melting, mixing, deaerating and filtering the photopolymer composition.

The photopolymer composition is extruded at 160° C. through a die. The extruded composition enters the rotating bank in a two-roll calender and is calendered between a film and an element, the film being a 0.005 inch (0.127 mm) flame-treated polyethylene terephthalate support film, and the element being the element described above except that the polyethylene terephthalate film with its silicone subbing is removed as the element is unwound and fed to the calender. The photopolymer layer in the unexposed state has an elastic modulus of 31 lbs/in$^2$ (2.18 kg/cm$^2$). The elastomeric overcoat layer contacts the extruded photopolymer and becomes laminated thereto. The elastomeric overcoat layer has an elastic modulus of about 194 lbs/in$^2$ (13.64 kg/cm$^2$) in the unexposed state. The element formed during calendering is 0.117 inch (2.98 mm) in thickness.

The photopolymer element is cooled with blown air and is passed under a bank of black light fluorescent tubes, Sylvania's BL lamps, placed transverse to the path of movement, continually exposing the element through its support to polymerize a predetermined thickness of the photopolymer layer adjacent the support. The element is cut into 18-inch (45.72 cm) lengths.

The photopolymer element is placed in an exposure unit, as described below, and is given an overall exposure in air through the support for a predetermined length of time (for example, a 0.112-inch (about 2.85 mm) thick photopolymer layer requiring the polymerization of an 0.080 inch (2.03 mm) portion of the layer is exposed for about 3 minutes depending on lamp intensity).

The polyethylene terephthalate film on the surface of the polyamide layer is stripped therefrom. The polyamide layer remains adhered to the elastomeric overcoat layer which is now photosensitive. The hard, flexible smooth polyamide surface is covered with an image-bearing transparency, and the photopolymer layer is imagewise exposed for 6 minutes under vacuum in a "Cyrel" 3040 Exposure Unit (registered trademark of E. I. du Pont de Numours and Company) fitted with Sylvania BL-VHO fluorescent lamps. The exposed photopolymer layer has an elastic modulus of about 109 lbs/in$^2$ (7.66 kg/cm$^2$). The exposed elastomeric overcoat layer has an elastic modulus of 204 lbs/in$^2$ (14.34 kg/cm$^2$).

After exposure the transparency is removed, and the exposed element is placed in a rotary drum-brush type "Cyrel" 3040 Processor. The polyamide layer and unpolymerized areas of the element are removed in the processor by washing with a mixture of 75 volume percent tetrachloroethylene/25 volume percent n-butanol. The developed element (printing plate) is placed in a forced hot air drier and is dried at 60° C. until the plate attains its original thickness. The dry plate is then detackified for 1 to 3 minutes in a solution aqueous acidic hypochlorite (900 parts water, 90 parts "Clorox", 10 parts conc. HCl). The wet plate is post-exposed in air for 10 minutes using the same exposure source used for the imagewise exposure described above. The plate has a "Shore" A hardness in the range of 50–55. The printing surface, polymerized photosensitive overcoat, has a deep blue contrasting color and is free of both "orange peel" and surface streaks.

The plate can now be mounted on a flexographic press cylinder with commercially available double sided adhesive tape and printed with standard flexographic inks. The print quality is equal to or better than that produced with rubber plates printed in the same manner.

EXAMPLE 2

The following elastomeric solution is prepared:

| Ingredient | Amount (%) |
|---|---|
| Polystyrene-polybutadiene-polystyrene block copolymer[1] | 8.89 |
| Methylmethyacrylate/acrylonitrile/butadiene/styrene tetrapolymer resin described in Example 1 | 4.46 |
| 1,6-Hexanediol diacrylate | 0.78 |
| 1,6-Hexanediol dimethacrylate | 0.57 |
| 2-Phenyl-2,2-dimethoxyacetophenone | 0.22 |
| Du Pont Milling Blue BL base dye[2] | 0.08 |
| Methylene chloride | 85.0 |

[1]"Kraton" 1102 block copolymer Shell Chemical Co., Polymers Division, Houston, Texas
[2]C.I. Acid Blue 59 dye, E. I. du Pont de Nemours and Company, Wilmington, DE The above-described elastomeric coating solution is coated by means of the extrusion die coater described in Example 1 onto a silicone-subbed polyethylene terephthalate film, 0.001 inch (0.025 mm) in thickness, release "Mylar" film, Custom Coating and Laminate, Inc., Worcester, MA. Approximately four feet (1.22 m) of sample having a thickness of 0.002 inch (0.051 mm) is prepared.

A thermoplastic photopolymerizable composition prepared as described in Example 1 is extruded into the rotating bank of a two-roll calender as described in Example 1. The extruded photopolymer is calendered between two elements, one element is a 0.005 inch (0.127 mm) flame-treated polyethylene terephthalate support film, the other element prepared as described in Example 1 consists of a polyamide resin layer supported on a polyethylene terephthalate film, 0.005 inch (0.127 mm) in thickness. A two-foot length of the element having the photosensitive elastomeric coating as described above is taped to the moving polyethylene terephthalate film bearing the polyamide layer such that the photosensitive elastomeric coating contacts the extruded photopolymer layer. The unexposed photopolymer layer has an elastic modulus as described in Example 1. The elastomeric overcoat layer has an elastic modulus of about 124 lbs/in$^2$ (8.72 kg/cm$^2$) in the unexposed state. The overall thickness of the final element is 0.117 inch (2.98 mm).

The element is cooled with blown air and a predetermined thickness of the photopolymer layer adjacent the support is polymerized as described in Example 1. The element is then cut so that the two-foot long coating is untouched. The polyethylene terephthalate film and its attached polyamide layer are removed leaving the following element structure top to bottom: (1) polyethylene terephthalate film with silicone subbing, (2) elastomeric overcoat layer, (3) photopolymer layer, 0.107 inch (2.72 mm) in thickness, and (4) polyethylene terephthalate film.

The photopolymer element is placed in an exposure unit, as described below, and is given an overall exposure in air through the support for a predetermined length of time (for example, a 0.109-inch (2.77 mm) thick photopolymer layer plus photosensitive overcoating requiring the polymerization of an 0.080 inch (2.03 mm) portion of the layer is exposed for about 3 minutes depending on lamp intensity).

The polyethylene terephthalate film including the silicone subbing (silicon resin adheres to film) is stripped therefrom. The reasonably hard, flexible smooth photosensitive overcoat surface is covered with an image bearing transparency, and the photosensitive overcoat and the underlying original photopolymer layer are imagewise exposed for 5 minutes under vacuum in a "Cyrel" 3040 Exposure Unit (registered trademark of E. I. du Pont de Nemours and Company) fitted with Sylvania BL-VHO fluorescent lamps. The exposed photopolymer layer has an elastic modulus as described in Example 1. The exposed elastomeric overcoat layer has an elastic modulus of 304 lbs/in$^2$ (21.37 kg/cm$^2$).

After exposure the transparency is removed, and the exposed element is placed in a rotary drum-brush type "Cyrel" 3040 Processor. The unpolymerized areas of the element are removed in the processor by washing with a mixture of 75 volume percent tetrachloroethylene/25 volume percent n-butanol. The developed element (printing plate) is placed in a forced hot air drier and is dried at 60° C. until the plate attains its original thickness. The dry plate is then detackified for 1 to 3 minutes in a solution of aqueous acidic hypochlorite (900 parts water, 90 parts "Clorox", 10 parts conc. HCl). The wet plate is post-exposed in air for 10 minutes using the same exposure source used for the imagewise exposure described above. The plate has a "Shore" A hardness in the range of 50–55. The printing surface, polymerized photosensitive overcoat, has a deep blue contrasting color and is free of both "orange peel" and surface streaks.

The plate can now be mounted on a flexographic press cylinder with commercially available double sided adhesive tape and printed with standard flexographic inks. The print quality is equal to or better than that produced with rubber plates printed in the same manner.

EXAMPLE 3

An overcoat solution is prepared from the following ingredients:

| Ingredient | Amount (parts) |
| --- | --- |
| Polystyrene-polyisoprene-polystyrene block copolymer described in Example 1 | 66.67 |
| Tetrapolymer resin described in Example 1 | 32.00 |
| Dye described in Example 1 | 1.33 |

The resin and dye are mixed for 10 minutes at 250° F. (121° C.) on a 1600 cc Banbury Mixer. The resulting blend is then granulated to approximately 0.125 inch (about 0.32 cm) diameter particle size, and is then added to methylene chloride to give a solution of about 5.6% solids. The solution is stirred for 16 hours at high speed with a Jiffy Mixer (made by Jiffy Mixer Co., Inc., 17981 Sky Park Circle, Suite G, Irvine, Calif. 92714). The block copolymer is then added, and the mixture is stirred an additional 8 hours. Any weight loss during mixing is made up by addition of methylene chloride.

The overcoat solution is extrusion coated onto a polyethylene terephthalate film support 0.005 inch in thickness (0.13 mm) which is pre-coated with a layer of a polyamide resin having a dry thickness of 0.00017 inch (0.004 mm). The film bearing the polyamide layer is prepared as described in Example 1.

The above-described overcoat solution is applied over the pre-coated polyethylene terephthalate film described above using a continuous web coater-drier to provide a dry coating weight of about 480 mg/dm$^2$. The web speed is 40 feet/minute (12.2 m/minute) and the drying temperature is 160° F. (71° F.)

An extruded sheet, 1.12 inch (28.5 mm) thick of a photopolymerizable composition on a 0.005 inch (0.127 mm) thick polyethylene terephthalate support is placed with the support side down in an aluminum platen dammed to a thickness of 0.080 inch (2.03 mm), the thickness of the finished printing plate. The overcoat bearing cover sheet is placed coated side down on the photopolymerizable layer, and is covered with an aluminum plate. The extruded sheet of the photopolymerizable composition is prepared as described in Example 1 except that the composition is extruded at 170° C.

The temperature is raised and pressure is gradually applied which spreads the photopolymerizable sheet throughout the dammed area of the platen. After the sheet is evenly distributed the temperature is raised to 140° C. and pressure in the range of 10,000 to 20,000 psi (703 to 1406 kg/cm$^2$) is applied and held for two minutes. The assembly is cooled in the press to less than 60° C. by flowing water through the press platens. The laminated element formed is removed from the press and is placed support side up under a bank of black fluorescent tubes, such as Sylvania's BL lamps. The element is exposed for 2 minutes through the support to polymerize a predetermined thickness of the photopolymerizable layer adjacent the adhered support. The polymerized portion of the element is designated a floor.

The element is then placed in a "Cyrel" 3040 Exposure Unit (registered trademark of E. I. du Pont de Nemours and Company) fitted with Sylvania BL-VHO fluorescent lamps. The photopolymerizable surface is covered with an image-bearing transparency (negative), and the element is exposed for 5 minutes while under vacuum. The duration of exposure is a function of the photopolymer sheet thickness, thickness of the polymerized floor and the type of image-bearing transparency used.

After exposure the transparency is removed, and the exposed element is placed in a rotary drum-brush type "Cyrel" 3040 Processor. The unpolymerized areas of the element are removed in the processor by washing for 5 minutes with 25 volume percent n-butanol in perchloroethylene. A 0.030 inch (0.76 mm) relief image is obtained. The developed element (printing plate) is placed in a forced hot air drier or other suitable drier and is dried at 60° C. for one hour. The dry plate is then detackified for 1 to 3 minutes in a solution of aqueous hypochlorite (900 parts water, 90 parts "Clorox", 10 parts conc. HCl) and is dried again. The dry plate is post exposed in air for 5 minutes using the same exposure source used for the imagewise exposure described above. The plate is then useful for printing.

EXAMPLE 4

An overcoat bearing polyethylene terephthalate 0.005 inch (0.127 mm) thick cover sheet described in Example 1 is placed with the coated side against the surface of an extruded sheet of a photopolymerizable composition (prepared as described in Example 1) on a 0.005 inch (0.127 mm) polyethylene terephthalate support. The photopolymer sheet and overcoat bearing cover sheet are passed through the nip of a "Cromalin" Laminator Model 2700 PIN (registered trademark of E. I. du Pont de Nemours and Company) at 104° C. (219° F.) roll temperature. The resulting plate is imagewise exposed and developed as described in Example 1 and is then useful for printing.

EXAMPLE 5

The ingredients that are used to prepare the photopolymerizable coposition described in Example 1 are placed on a Bolling 18 inch×4 inch (0.457×0.102 m) rubber mill (roll temperature, 140° C.) and mixed for 10 minutes to give a homogenous photopolymer composition. The composition is then fed onto a Farrel 4 Roll Inclined Z Calender (roll temperature is 140° C.). Photopolymer is fed into the nip between the top two rolls. The photopolymer is calendered between a flame-treated polyethylene terephthalate support 0.005 inch (0.127 mm) in thickness and the overcoat bearing 0.005 inch (0.127 mm) cover sheet described in Example 1. The flame-treated surface, and the overcoat coating are against the photopolymer surface. The resulting plate is imagewise exposed and developed as described in Example 1 and is then useful for printing.

We claim:

1. A process for preparing a flexographic printing plate which comprises
   (1) exposing to actinic radiation through an image a flexographic photopolymerizable element prepared by passing into the nip of a calender a mass of a hot photopolymerizable composition comprising an elastomeric binder, an ethylenically unsaturated compound having at least one terminal ethylenic group, and a photoinitiator or photoinitiator system, and, while hot, calendering the photopolymerizable composition between a support and a multilayer cover element to form a photopolymerizable layer therebetween, wherein the multilayer cover element consists essentially of a flexible cover film and a layer of an elastomeric composition and optionally between the flexible cover film and the layer of elastomeric composition a flexible polymeric film, the layer of elastomeric composition being adjacent to the photopolymerizable layer and being photosensitive or becoming photosensitive during or after calendering by contact with the photopolymerizable layer, said layer of elastomeric composition comprising an elastomeric polymeric binder and optionally a second polymeric binder and a nonmigratory dye or pigment and, in addition, when said layer of elastomeric composition is photosensitive one or more ethylenically unsaturated monomeric compounds and/or photoinitiator or initiator system, the cover film of said photopolymerizable element optionally has been removed after calendering but prior to exposure,
   (2) removing the image and cover film if still present, and
   (3) removing by liquid development the flexible polymeric film, if present, and the unexposed areas of the layer of elastomeric composition and photopolymerizable layer; and
   (4) optionally removing any residual liquid developer by drying.

2. A process according to claim 1 wherein after liquid development and optional drying the element is, in either order, detackified by treating with a solution containing free halogen, and postexposed to actinic radiation.

3. A process according to claim 1 wherein the flexible polymeric film is present in the multilayer cover element between the flexible cover film and the layer of elastomeric composition.

4. A process according to claim 1 wherein the mass of photopolymerizable composition is passed into the calender nip by an extruder.

5. A process according to claim 1 wherein the mass of photopolymerizable composition is passed into the calender nip as a hot melt from a mixing mill.

6. A process according to claim 1 wherein calendering occurs between two flexible supports, one of which is subsequently removed from the photopolymerizable layer, and the multilayer cover element is laminated to the photopolymerizable layer.

7. A process according to claim 1 wherein calendering occurs between two flexible sheets, one of which is subsequently removed from the photopolymerizable layer, and the multilayer cover element and photopolymerizable layer are pressed into contact.

8. A process according to claim 1 wherein the elastomeric layer in the multilayer cover element is a photopolymerizable elastomeric layer.

9. A process according to claim 1 wherein the flexible cover film in the multilayer cover element is a film bearing a silicone subbing layer.

10. A process according to claim 3 wherein the flexible polymeric film is a polyamide film.

11. A process according to claim 1 wherein the elastomeric composition in the multilayer cover element comprises an elastomeric block copolymer.

12. A process according to claim 11 wherein the block copolymer is a polystyrene-isoprene-polystyrene block copolymer.

13. A process according to claim 11 wherein the block copolymer is a polystyrene-polybutadiene-polystyrene block copolymer.

14. A process according to claim 1 wherein the photopolymerizable composition is passed into the nip of the calender by extruding at a temperature in the range of about 130° to 200° C.

15. A process according to claim 1 wherein the elastomeric binder of the photopolymerizable composition is an elastomeric block copolymer.

16. A process according to claim 15 wherein the ethylenically unsaturated compound has two terminal ethylenic groups.

17. A process according to claim 16 wherein the ethylenically unsaturated compound is hexamethylene glycol diacrylate, hexamethylene glycol dimethacrylate or a mixture of both.

18. A process according to claim 1 wherein a colorant is present in the photopolymerizable layer.

19. A process according to claim 18 wherein a nonmigrating dye or pigment is present in the layer of elastomeric composition of the multilayer cover element which provides a contrasting color with the colorant in the photopolymerizable layer.

* * * * *